United States Patent
Turcu et al.

(10) Patent No.: US 10,620,159 B2
(45) Date of Patent: Apr. 14, 2020

(54) FIELD KELVIN PROBE

(71) Applicant: TeCom AS, Bergen (NO)

(72) Inventors: Eugen Florin Turcu, Bergen (NO); Michael Rohwerder, Bergen (NO)

(73) Assignee: INDIKEL AS, Bergen (NO)

( * ) Notice: Subject to any disclaimer, the term of this patent is extended or adjusted under 35 U.S.C. 154(b) by 220 days.

(21) Appl. No.: 15/739,945

(22) PCT Filed: Jun. 24, 2016

(86) PCT No.: PCT/NO2016/050140
§ 371 (c)(1),
(2) Date: Dec. 26, 2017

(87) PCT Pub. No.: WO2016/209087
PCT Pub. Date: Dec. 29, 2016

(65) Prior Publication Data
US 2018/0196002 A1      Jul. 12, 2018

(30) Foreign Application Priority Data

Jun. 24, 2015 (GB) .................................. 1511114.9
Jun. 24, 2015 (NO) .................................. 20150829

(51) Int. Cl.
*G01N 27/60* (2006.01)
*G01R 1/07* (2006.01)
*G01N 27/00* (2006.01)
*G01R 1/073* (2006.01)
*G01R 35/00* (2006.01)

(52) U.S. Cl.
CPC ........... *G01N 27/60* (2013.01); *G01N 27/002* (2013.01); *G01R 1/07* (2013.01); *G01R 1/07314* (2013.01); *G01R 35/007* (2013.01)

(58) Field of Classification Search
CPC ...... G01N 27/60; G01R 1/07; G01R 1/07314; G01R 35/007; G01R 1/06722; G01R 1/073; G01R 21/133; G01R 31/2648
USPC .............................................. 324/754.05, 452
See application file for complete search history.

(56) References Cited

U.S. PATENT DOCUMENTS 5,374,888 A * 12/1994 Karasawa .......... G01R 1/07314
                                                            324/750.23
5,974,869 A    11/1999 Danyluk et al.
(Continued)

FOREIGN PATENT DOCUMENTS

CN         203965529 U  *  11/2014
CN         203965529 U     11/2014
(Continued)

OTHER PUBLICATIONS

Evers et al., The Hydrogen electrode in the "dry": A Kelvin probe approach to measuring hydrogen in metals, 24 Electrochem. Commn's 85-88 (2012) (Year: 2012).*
(Continued)

*Primary Examiner* — Jermele M Hollington
*Assistant Examiner* — Robert P Alejnikov, Jr.
(74) *Attorney, Agent, or Firm* — Hershkovitz & Associates, PLLC; Abe Hershkovitz

(57) ABSTRACT

A Kelvin probe system is provided. The invention is achieved using a rotating Kelvin probe head comprising a Kelvin probe face is provided on a side face of the Kelvin probe head.

20 Claims, 7 Drawing Sheets

(56) References Cited

U.S. PATENT DOCUMENTS

| | | | | |
|---|---|---|---|---|
| 6,051,982 A | * | 4/2000 | Alcoe | G01R 1/06733 324/750.16 |
| RE39,803 E | | 9/2007 | Danyluk et al. | |
| 2004/0057497 A1 | * | 3/2004 | Lagowski | G01K 1/12 374/163 |
| 2014/0333334 A1 | * | 11/2014 | Akahori | G01R 1/0466 324/750.25 |

FOREIGN PATENT DOCUMENTS

| | | | | |
|---|---|---|---|---|
| DE | 102006044962 B4 | * | 4/2011 | G01N 27/002 |
| GB | 2439439 A9 | | 12/2007 | |
| WO | WO 1991019972 | | 12/1991 | |

OTHER PUBLICATIONS

Search Report and Written Opinion of PCT/NO2016/050140, dated Nov. 3, 2016.
M. Stratman et al., Corr. Sci. 6-7, 1990, 681-696.
Kurtev, I. et al., Modification of a rotating dynamic capacitor for contact potential difference measurements, J. Phys. E: Sci. Instrum., Jul. 1983, vol. 17, No. 7, p. 594-595.
https://www.researchgate.net/publication/231129114, A Kelvin probe based method for measuring the electron emission yield of insulators and insulated conductors subjected to electron irradiation.

* cited by examiner

FIELD KELVIN PROBE

BACKGROUND OF THE INVENTION

Technical Field

The invention relates to measurement systems in general, and more specifically, to a Kelvin probe system and a method for operating the same.

Background Art

Kelvin probes are acknowledged in the prior art. The scanning and the non-scanning versions of the Kelvin Probe (SKP and KP respectively) are standard, non-contact, laboratory instruments routinely used for the measurement of surface charge or surface work functions/Volta potentials. In recent years, it has been demonstrated that KP can directly measure corrosion potentials on coated or bare metallic surfaces. This pioneering work was started by M. Stratmann and co-workers, as in WO1991019972 and M. Stratmann, H. Streckel, *Corr. Sci.* 6-7, 1990, 681-696.

Briefly, in this prior work, the KP's core is an electrical capacitor in which one vibrating plate is actuated at a certain height above a metallic substrate acting as the second plate. Volta potentials measured from a sinusoidal current are converted in real-time into corrosion potentials.

This technology comes with several problems. First of all, there is a strong vibration associated with the probe vibrating to change the distance to the object to be measured, leading to noise and mechanical problems. Secondly, the probe tends to be thin and long to obtain precise measurements, and thus is also fragile. This extended geometry combined with vibrations lead to acoustic modes that, in turn, make the thin probe also move laterally to the object to be measured and not just transversely over a single spot. Thirdly, long term tests will require calibrations which are problematic in the field, and also require interruptions of operation.

Also, KURTEV, I. et al., "Modification of a rotating dynamic capacitor for contact potential difference measurements", *J. Phys. E: Sci. Instrum.*, July 1983, Vol. 17, no. 7, page 594-595 relates to a Kelvin probe system where the probe surface is facing along the end of the axle and not on a side face.

As well, U.S. Pat. No. 5,974,869 A1 relates to a non-vibrating capacitance probe.

CN203965529 discloses an automatic measuring system for two-dimensional distribution of electric charges on the surface of an insulating material. The automatic measuring system comprises a sealed cavity which is internally equipped with a two-dimensional electric control displacement table, wherein a sample to be tested is fixedly arranged on the two-dimensional electric control displacement table by virtue of a back board electrode. Upper and lower ends of the sample to be tested are connected with a high-voltage electrode and a grounding electrode respectively. An insulating clamp is arranged at a movement end of a one-dimensional magnetic coupling linear rotation driver, and a Kelvin probe is fixedly arranged on the insulating clamp. A detecting point of the Kelvin probe is vertical to the sample to be tested, and an output signal leading wire of the Kelvin probe is connected with an electrometer outside the sealed cavity, and a signal output end of the electrometer is connected with a data acquisition system of a computer. A connecting tube is arranged at the other side of the sealed cavity, and a vacuum pump is arranged at the tail end of the connecting tube. The automatic measuring system is used for measuring the two-dimensional distribution of surface charge density of the insulating material, so that flashover characteristic research contents and charge distribution measuring means of the insulating material are enriched.

However, no Kelvin probe surfaces or calibration is disclosed. Moreover, this appears to be based on an existing device from Trek Inc., in a system as disclosed in https://www.researchgate.net/publication/231129114_A_Kelvin_probe_based_method_for_measuring_the_electron_emission_yield_of_insulators_and_insulated_conductors_subjected_to_electron_irradiation.

SUMMARY OF THE INVENTION

Therefore, a main objective of the present invention is to provide a system and a method that overcomes the shortcomings in prior devices.

The objective is achieved according to the present invention by a rotating Kelvin probe for analyzing a sample for testing, comprising a drive controlled and powered by a drive control/power for rotating an object around a rotational axis, and a Kelvin probe head connected to the drive, comprising a Kelvin probe having at one end a Kelvin probe face. The objective also is achieved according to the present invention by a calibration system located away from a sample to be measured, wherein the calibration sample operates as a built-in reference surface for the calibration of the rotating Kelvin Probe. The objective is further achieved according to the present invention by a method for operation using the Kelvin Probe with the calibration system, wherein calibration is performed on a first calibration sample that is made of a material corresponding to a sample to be measured having not been exposed to hydrogen, and calibration is performed on a second calibration sample that is made of a material corresponding to a sample to be measured that has been exposed to hydrogen.

A number of non-exhaustive embodiments, variants or alternatives of the invention are defined by the claimed invention.

The present invention attains the above-described objective by a probe having a longitudinal axis wherein the probe rotates around an axis not coinciding with the longitudinal axis.

In a first aspect of the invention, a Kelvin probe system is provided for analyzing a sample for testing, the Kelvin probe system comprising a drive controlled and powered by a drive control/power for rotating a shaft, a Kelvin probe head connected to the shaft, comprising a Kelvin probe having at the end, a Kelvin probe face, wherein the Kelvin probe face is provided on a side face of the Kelvin probe head.

In one embodiment, the Kelvin probe head comprises a plurality of Kelvin probe faces.

In another embodiment, the plurality of Kelvin probe faces are made of more than one material.

In another embodiment, at least one Kelvin probe face is made of more than one material.

In another embodiment, more than one of the Kelvin probe faces are of made of different material.

In another embodiment, more than one of the Kelvin probe faces are of different sizes.

In another embodiment, the plurality of Kelvin probe faces are distributed at different angular positions along the surface of the Kelvin probe head.

In another embodiment, the plurality of Kelvin probe faces are distributed at different positions along the width of the Kelvin probe head.

In another embodiment, at least one Kelvin probe face is detachable.

Another aspect of the invention is a calibration system provided for a Kelvin probe system, wherein the Kelvin probe system further comprises a calibration sample located away from a sample to be measured, wherein the calibration sample operates as a built-in reference surface for the calibration of the rotating Kelvin Probe.

In one embodiment, the calibration system for a Kelvin probe system further comprises a plurality of calibration samples, wherein the calibration samples are made of different materials.

Another aspect of the invention is a method provided for measuring the presence of hydrogen using a Kelvin probe system, wherein the Kelvin probe system measures at least one from the group of surface charges and interface dielectric constants, at a metallic interface with a sample to be measured.

The presence of hydrogen in a metal such steel is detectable by the changes in the work function of the metal induced by the freely diffusing protons through the metal body.

In one embodiment, the Kelvin probe system further comprises a calibration system for the Kelvin probe system, wherein calibration is performed on a first calibration sample made of a material corresponding to a sample to be measured that has not been exposed to hydrogen, and calibration is performed on a second calibration sample made of a material corresponding to a sample to be measured that has been exposed to hydrogen.

In another embodiment, the method comprises depositing a Palladium (Pd) layer, or similar metals with hydrogen-adsorbing properties, over the sample to be measured prior to operating the Kelvin probe system.

One of the technical advances of the claimed invention over prior art is that the probe rotates rather than vibrates.

These effects provide, in turn, several further advantageous effects:
- it makes it possible to avoid noise;
- it makes the probe less fragile, particularly if the probe is embedded in a body;
- it avoids acoustic modes with associated uncertainties regarding actual positioning; and
- it allows for self calibration, as well as continuous self calibration.

BRIEF DESCRIPTION OF THE DRAWINGS

The above and further features of the invention are set forth with particularity in the appended claims, and together with advantages thereof, will become clearer from consideration of the following detailed description of an exemplary embodiment of the invention, given with reference to the accompanying drawings.

The invention will be further described below in connection with exemplary embodiments which are schematically shown in the drawings, wherein.

DESCRIPTION OF THE REFERENCE SIGNS

The following reference numbers and signs refer to the drawings:

| | |
|---|---|
| 100 | Kelvin probe system |
| 102 | Drive |
| 104 | Drive control/power |
| 106 | Shaft |
| 108 | Electrical pickup, slip ring |
| 109 | Shaft encoder |
| 110 | Kelvin probe shielding |
| 112 | Shielding aperture |
| 120 | Kelvin probe head |
| 122 | Kelvin probe |
| 124, 124A-G, 402, 404 | Kelvin probe face |
| 126, 406 | Electrical isolator |
| 128 | Body |
| 132 | Calibration sample |
| 134 | Sample for testing, sample to be measured |
| 140 (300) | Electronics unit |
| 200 | Kelvin probe system according to prior art |
| 202 | Vibrator |
| 204 | Vibrator control/power |
| 206 | Shaft |
| 208 | Electrical pickup |
| 209 | Shaft position readout |
| 220 | Kelvin probe head |
| 222 | Kelvin probe |
| 224 | Kelvin probe face |
| 234 | Sample for testing |
| 240 | Electronics unit |
| 302 | Actuator controller |
| 304 | Actuator |
| 306 | Amplifiers/Filters |
| 308 | Signal processing unit |
| 312 | Data visualisation unit |
| 314 | Data logger |
| 316 | Self diagnosis unit |

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Figure 1:
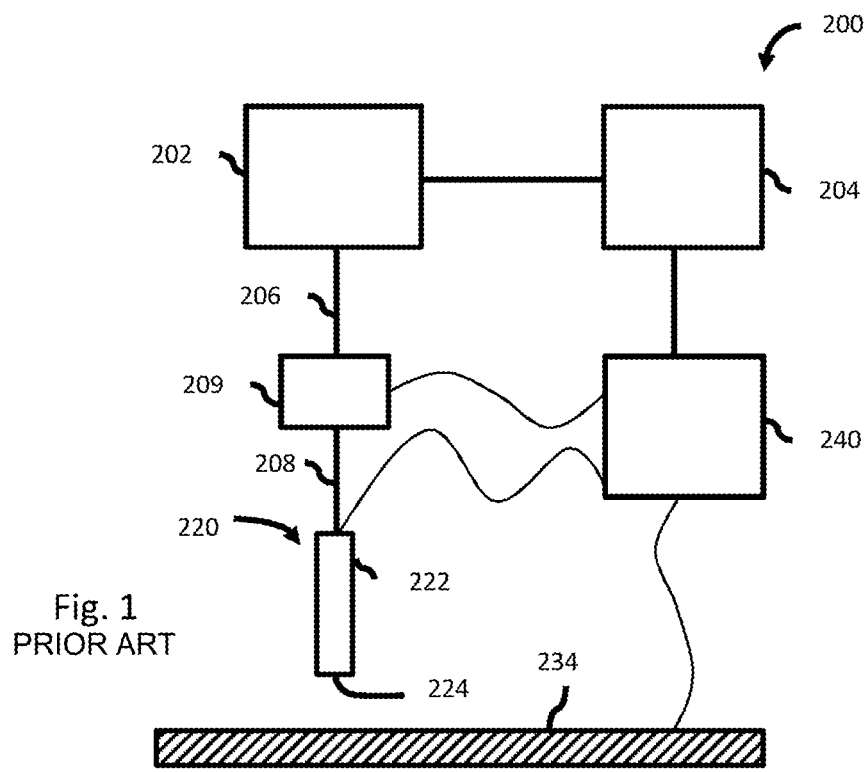
FIG. 1 shows a probe according to prior art.

The invention will be further described in connection with exemplary embodiments which are schematically shown in the drawings, wherein FIG. 1 shows a Kelvin probe system 200 according to prior art. A vibrator 202 controlled and powered by a drive control/power 204 drives a shaft 206 connected to a Kelvin probe head 220 and a shaft position readout 209. The Kelvin probe head comprises a Kelvin probe 222, typically a metal body having at the end a Kelvin probe face 224. As the vibrator drives the shaft longitudinally, the distance between the Kelvin probe face and a sample for testing 234 varies. This gives rise to a varying coupling, and thus a varying electrical potential between the sample and the probe, and is read out through an electrical pickup 208. The distance is monitored using a shaft position readout 209. An electronics unit 204 is connected to the electrical pickup 208 and shaft position readout 209, and to the sample 234 to close the circuit, and determines the contact potential, typically using a lock-in amplifier.

The Kelvin probe can be used to identify a material (e.g., a corrosion product) based on the potential between the surfaces of a known conductor and a sample when they are brought into electrical contact directly or via ground. This contact potential, also known as the Volta potential, depends on the work functions of the materials being used. The work function is the amount of energy needed to release electrons from a surface of a material.

Figure 2:
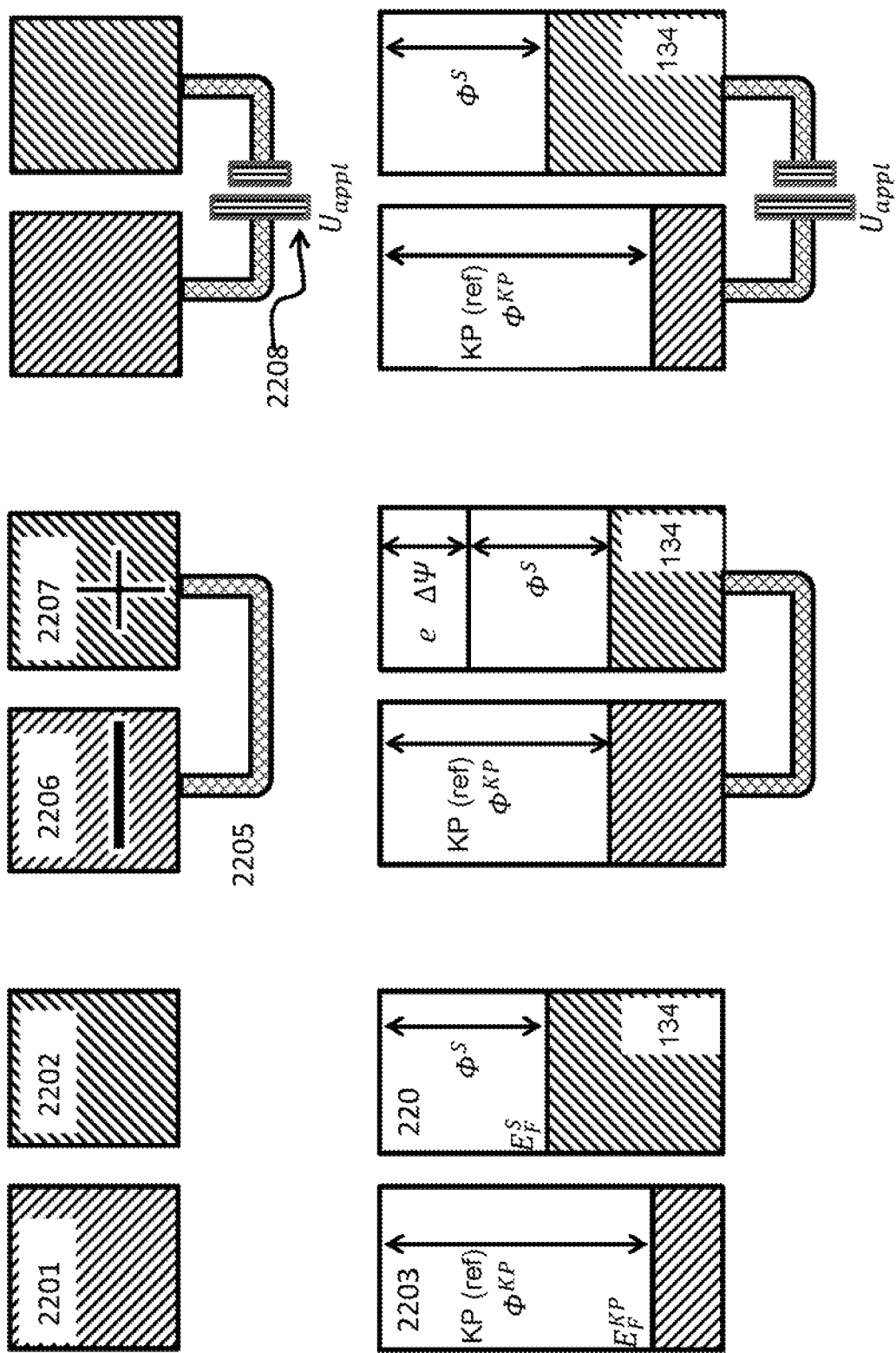
FIG. 2 shows a diagram of Volta potentials between a probe and a sample.

FIG. 2 shows a diagram of Volta potential ($\Delta\Psi$) difference established between a Kelvin probe and a test sample.

The basic principle behind the Kelvin Probe is to vary the capacitive coupling between the known material (probe) and the sample to generate an alternating current with an amplitude proportional to the contact potential. By adding a bias voltage to the known material, a change in amplitude can be observed. The amplitude will drop to zero if the bias voltage is equal to, but with reversed polarity of, the contact potential. Hence, the bias voltage, $U_{appl}$, is a measure of the contact potential.

The capacitance C between the probe and the sample is given by:

$$C = \frac{Q}{V} = \varepsilon_r \varepsilon_0 \frac{A}{d}.$$

Since the voltage is given as the sum of contact potential, and added bias is kept constant during the measurement, a current is generated when the capacitance is varied. The current is given by:

$$i = \frac{\partial Q}{\partial t} = \Delta\Psi \frac{dC}{dt} + C \frac{d(\Delta\psi)}{dt}.$$

Since $$\frac{d(\Delta\psi)}{dt} = 0,$$

the current becomes $$i = \Delta\Psi \frac{dC}{dt}.$$

There are fundamentally three different ways to vary the capacitance: [[By]] by area, A, and by distance, d, and by changing the dielectric properties ($\varepsilon = \varepsilon_r \varepsilon_0$) of the space between the plates (either progressively or intermittently). In addition, any possible combinations of these three parameters could be deployed to achieve a variable capacitance. A change of the dielectric properties can practically be achieved, for instance, by cyclically moving to and from the plates, a sheet made of various substances, each characterized by a different dielectric constant.

When varying the capacitance by distance, the distance between the probe and the sample is given by $$d = d_0 + d_1 \sin \omega t$$

$$i = (\Delta\psi - U_{appl}) \varepsilon_r \varepsilon_0 A \frac{d}{dt}\left(\frac{1}{d_0 + d_1 \sin \omega t}\right)$$

$$i = (\Delta\psi - U_{appl}) \frac{\varepsilon_r \varepsilon_0 A d_1 \omega \cos \omega t}{(d_0 + d_1 \sin \omega t)^2}.$$

Since the Kelvin probe face is small compared to the Kelvin probe head, the effective area changes are negligible in normal working conditions where the Kelvin probe face is close to the sample to be tested. Changes in the effective area are therefore not discussed.

When varying the capacitance by dielectric, the area of the dielectric present between the plates at a particular time must be varied with time. The actual equation describing the induced AC current depends on the construction (number of material, distribution of materials within the agglomerate, etc.), and it can be generalized as:

$$i = (\Delta\psi - U_{appl}) \frac{\partial C}{\partial t} \text{ where}$$

$$C(A, d) = \varepsilon_r \varepsilon_0 \frac{A}{d}.$$

However, for one single probe face, rotating at frequency ($\nu = \psi/2\pi$), the shape of the AC signal would have a shape similar to that corresponding to a vibrating needle, which is a sinus wave but with the pics separated by a flat line. Two probes mounted 180° apart would still resemble the curves, however, with a shorter flat area in between the pics (similar with the curve on FIG. 9). Seven probes mounted at 52.4° would differ from the previous two cases. A real oscillogram obtained with a probe head with seven faces is illustrated in FIG. 5.

To enhance the magnitude of the AC current, an aggregate of alternating various material with high difference in dielectric constant can be used (for example, trivial plastic such as polypropylene for low dielectric constant, and mixed oxides such as PbMgNbO3+PbTiO3 for high constant).

Figure 5:
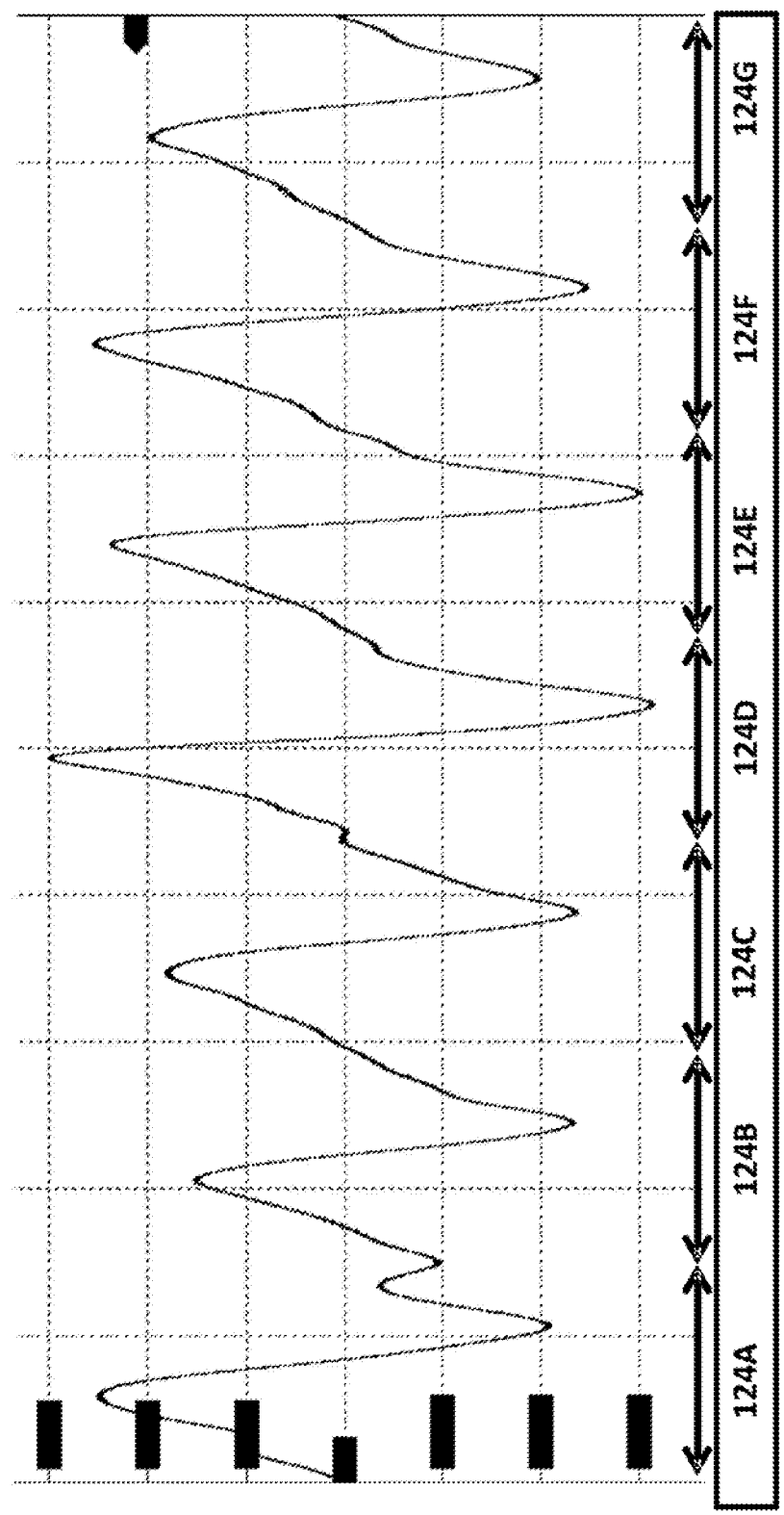
FIG. 5 shows an example of measurement curves using an instrumentation system according to FIG. 4.

FIG. 5 shows an example of a measurement curve or oscillogram wherein the Kelvin probe head comprises seven Kelvin probe faces 124A-G each separated by an electrical isolator 126. The curve shows, on the vertical axis, the measurements for each Kelvin probe face as indicated under the horizontal axis. Each of the seven sensors can be attributed to one of the seven waves in the oscillogram, with a probe diameter of 63 mm, a probe width of 23 mm, the width of the sensor element at 5 mm, and spacing between two consecutive sensor elements at 27 mm.

The core of the present invention is to replace the prior art vibrator 202 with a rotating structure, wherein a revolution of a rotating structure changes the capacitive coupling between a probe face and a sample.

The capacitive coupling is determined by both the effective area A of the Kelvin probe face with respect to the sample for testing, as well as the distance d between the Kelvin probe face and the sample for testing. The capacitive coupling between the Kelvin probe, other than the face and the sample for testing, is considered negligible.

Figure 3:
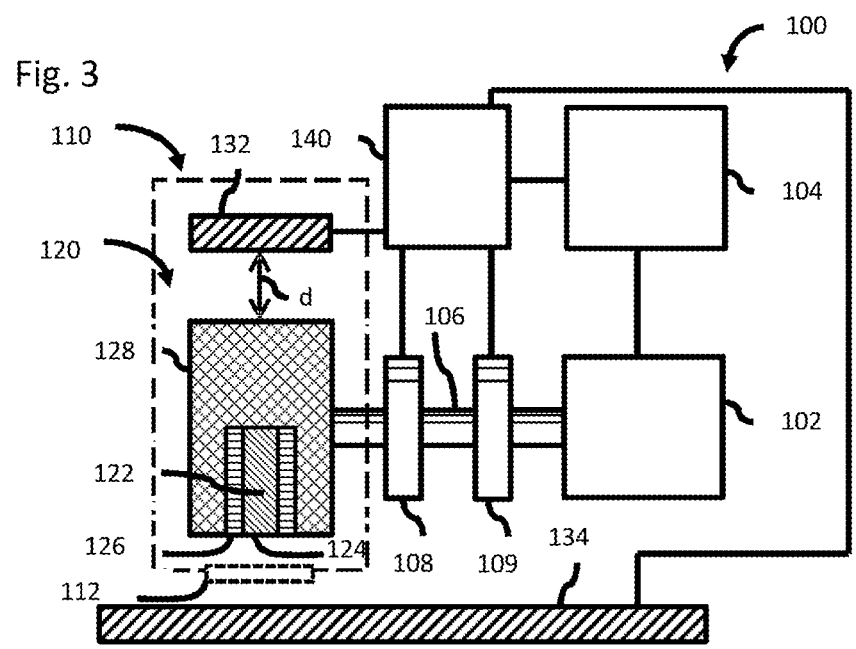
FIG. 3 shows an embodiment of the present invention.

The embodiment of the apparatus according to the invention shown in FIG. 3 shows a Kelvin probe system 100. A drive 102 controlled and powered by a drive control/power 104 rotates a shaft 106 connected to a Kelvin probe head 120 and a shaft encoder 109. The Kelvin probe head comprises a Kelvin probe 122, typically a metal body, having at the end a Kelvin probe face 124. As the drive rotates, the shaft rotates, and the distance between the Kelvin probe face and a sample for testing 134 varies. This gives rise to a varying coupling, and thus, a varying electrical potential between the sample and the probe, and is read out through an electrical pickup or slip ring or rotating electrical connector 108. The distance between the Kelvin probe face 124 and the sample 134 is determined using a shaft encoder 109. An electronics unit 104 (the drive control/power) is connected to the electrical pickup or slip ring 108 and shaft encoder 109, and to the sample 134 to close the circuit, and determines the contact potential, typically using a lock-in amplifier.

The drive 102 is an electrical motor operating at a steady angular speed. Variations in angular speed, typically stated as rotations per minute or RPM, are undesirable as these can cause problems with the phase locked loop in the lock in the amplifier of the electronics unit. Similarly, the drive should be essentially vibration free, and the rotating parts should be well-balanced. Considering the rather large size (in the cm$^2$ range) of the sensing probes that can be accommodated in the rotating Kelvin probe head, it is expected that the signal-to-noise ratio is much higher compared to the traditional vibrating needle Kelvin probe. Therefore, the analogous/digital lock-in amplifier can be replaced by appropriate software to filter out unwanted signals (noise).

Unlike the pick-up in the prior art, a pick-up for a rotating system would need to be adapted. Tests show that a slip ring 108 works well in connecting the rotating Kelvin probe face with the non-rotating electronics unit.

The Kelvin probe head 120 is preferably a cylindrical body 128 extending coaxially from the shaft 106, where the Kelvin probe 122 is embedded. Again, the Kelvin probe head, being a rotating part, should be well-balanced to avoid excessive vibrations. Several materials can be used, though metallic or otherwise electrically conducting materials are beneficial in screening the Kelvin probe from electromagnetic noise.

The Kelvin probe 122 is a slim metal cylinder embedded into the Kelvin probe head, and positioned non-coaxially with respect to the shaft 106. The probe is positioned such that the end face of the probe extends to and is flush with the side face of the Kelvin probe head. If the Kelvin probe head 120 is conducting, the Kelvin probe is electrically isolated from the Kelvin probe head using an electrical isolator 126.

The end face of the Kelvin probe 122 flush with the side face of the Kelvin probe forms the Kelvin probe face 124, and is the only Kelvin probe part which is exposed to the sample 134.

In an aspect of this embodiment, the Kelvin probe system is provided with a calibration sample 132 located at a position away from the sample for testing 134. This means that during a full revolution of the Kelvin probe head, the Kelvin probe face is alternatively exposed to the sample for testing and to the calibration sample.

Since the calibration sample is a known material located at a known position and a known distance, this knowledge can be used for continuous calibration of the system. A plurality of calibration samples can be provided at different positions, for instance, comprising a calibration sample similar to the materials expected to be found in the sample for testing, thus providing better identification of the materials in the sample for testing. Materials expected to be found can be both un-corroded material, corroded material, corrosion by-products and other materials.

With a calibration sample, the system is able to perform a calibration between measurements of the sample for testing. Since the position and material properties of the calibration sample are known, a calibration system can compensate for drift in the measurement of the sample for testing without interrupting the measurement process.

The location of the calibration sample is located at a position readable by the Kelvin probe head, away from the position for the sample for testing, preferably at the same distance as the distance to the sample for testing.

Since, in some embodiments, the calibration sample and the sample for testing both can be visible to the Kelvin probe head at all times, it is advantageous to use a geometry that avoids reading both at the same time. This can be done by interleaving reading of the calibration sample and the sample for testing.

Figure 10:
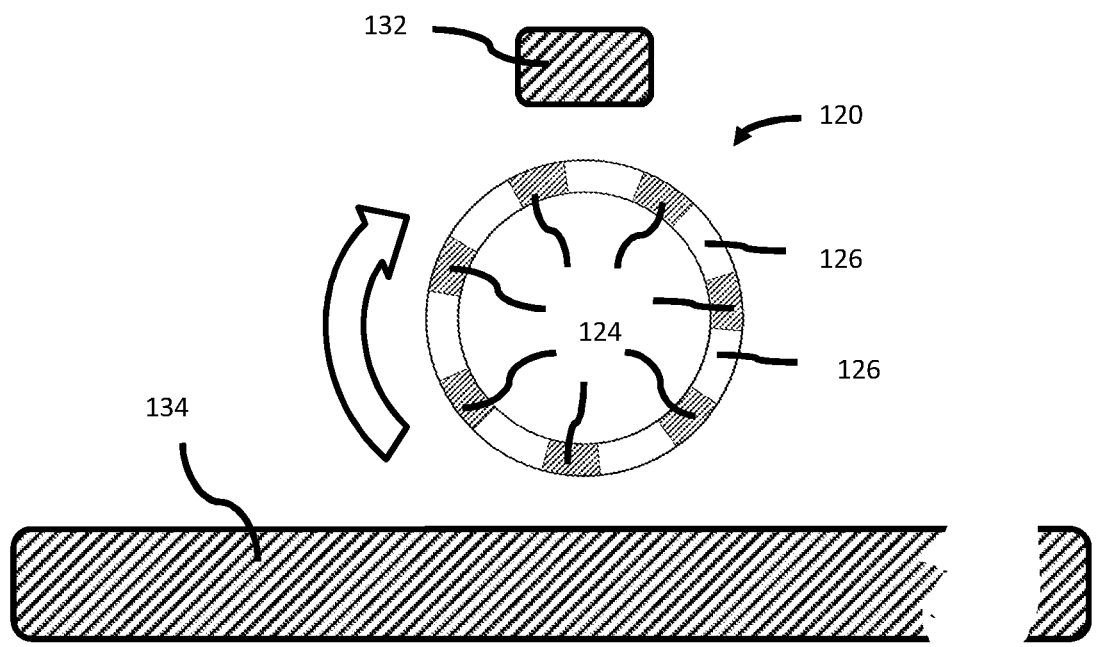
FIG. 10 shows an embodiment of a geometry for interleaved reading of a sample for testing and a calibration sample.

FIG. 10 shows an embodiment of a geometry for interleaved reading of a sample for testing and a calibration sample, wherein a Kelvin probe face 124 faces either sample while an insulator 126 faces the other sample. This has the advantage of making it possible to connect all of the Kelvin probe faces to the same slip ring or rotating electrical connector or capacitive coupling.

The Volta potential difference depends on the material used for the Kelvin probe face and for the sample for testing. It can be beneficial to test with different materials for the Kelvin probe face.

Figure 4:
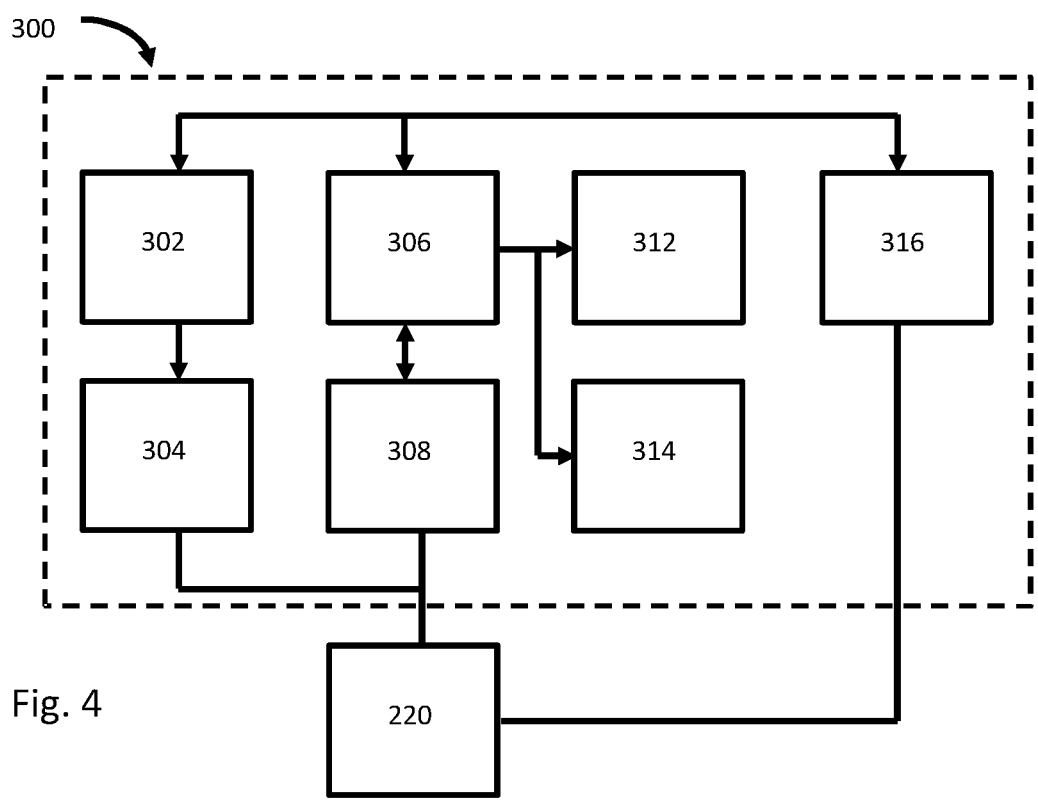
FIG. 4 diagrammatically illustrates an embodiment of an instrumentation of the embodiment according to FIG. 3.

An electronics unit is provided. FIG. 4 shows a preferred embodiment of an electronics unit 300 (reference numeral 140 in FIG. 1) comprising individual parts. An actuator control 302 controls an actuator 304. The actuator in this case is any device that can deliver a rotational movement, i.e. rotation, to the measuring probe. The device can, for instance, be any motor that is electric, spring-powered or air-driven. The measuring probe can be attached to the motor via a gearbox. A Kelvin probe is connected to a signal processing unit 308, and the AC current generated by the probe movement is first pre-amplified, together with the noise. The amplified signal and noise is then digitized and filtered to improve the signal-to-noise ratio. Once the signal is digitized, it can be processed in any imaginable way. This, in turn, is connected to a unit with amplifiers/filters 306, providing data for visualization 312 and/or data logger 314 for recording said data.

Preferably, a self diagnosis unit 316 is provided, operatively connected to the actuator controller 304, the amplifier/filters 306 and, if present, a calibration unit.

A preferred use of a system as disclosed above is for hydrogen measurements. Since a Kelvin Probe measures work function differences established between two electroconductive materials when they are electrically connected with each other, any phenomena affecting the value of a work function would be detectable by the Kelvin probe. The following examples are to be considered non-limiting.

1. Corrosion will change surface charges and interface dielectric constants at a metallic interface (metal-gas, metal-electrolyte, etc.).
2. Diffusible matter able to permeate through metals can reach a metallic interface from the bulk of the metal; hence, the work function of that permeated material will change compared to the work function of the pristine metal (free of diffusible mater). Such diffusible mater can be, for instance, hydrogen (or protons as it is quite unlikely that a hydrogen atom can diffuse through the metal lattice as an atomic entity). To some extent, ions of alloying elements and impurities could diffuse too, especially at high temperatures.
3. Chemical or physical interaction between the environment and a surface of an electroconductive material (metal, semiconductor, oxide covered metal, etc.) could cause significant changes of the work function.

Hydrogen is, in many situations, a side product of a corrosion process. When hydrogen is formed, upon reduction of hydrated protons ($H_3O^+$) on the cathodic area near an active corrosion site, it will enter, to various degrees, the metal. The hydrogen diffuses (permeates) throughout the steel at rates depending on the concentration of hydrogen on the entry site, and on the chemical composition of the steel (number of traps).

Eventually, they will reach the other side (exit side) and will be oxidized back to $H_3O^+$, or will reduce the metallic oxides present on the exit metallic surface. The hydrogen leaving the sample at the exit side will influence the work function. To enhance the detection limit, Palladium (Pd) layers deposited (thin films) on the exit site allow hydrogen to concentrate in the Pd. In such a case, the Kelvin probe measures changes of the work function of the Pd. This makes the detection very sensitive (below 10 ppb hydrogen in Pd) and quantitative. See "The hydrogen electrode in the "dry": A Kelvin probe approach to measuring hydrogen in metals", S. Evers, M. Rohwerder, *Electrochemistry Communications,* 24 (2012) 85-88.

In use, a Kelvin probe detects internal corrosion in steel tanks, pipelines, and from the outside. The measurement is accomplished with or without the additional Palladium layer.

The Kelvin probe can be deployed as an internal corrosion detector, as above, as a hydrogen leakage sensor (i.e. for hydrogen tanks in transportation or storage, etc.), and as a Hydrogen Induced Stress Cracking (HISC) risk indicator, as it can monitor hydrogen build up in steel.

It should be noted that, when using Pd covered steel, the field data can be compared to tabulated data to quantify the hydrogen content, in addition to detecting the presence of hydrogen qualitatively.

It should be noted that besides corrosion as a source, hydrogen can permeate steel during the fabrication process (i.e., in the raw steel), during assembly (welding), and in operation (corrosion due to transported fluids).

A number of variations on the embodiments disclosed above can be envisioned. For instance, determination of rotational position can be performed in several different ways. A single position indicator, such as an impulse switch, can be used with a phase locked loop to determine position from timing between consecutive impulses, preferably filtered by, for instance, a Kalman filter.

Such an impulse switch can be a mechanical readout with an electric switch, a magnetic readout using for instance a Hall effect sensor, an optical readout using a photo diode and a photo cell, or similar methods.

Also, a calibration sample in a known position can be used as the impulse switch, for instance, by determining a threshold value indicating a known position.

Alternatively, the sample 134 itself can be used, though this is more demanding as the true position of the sample is not always known, especially when repositioning the measurement system.

In another embodiment, the drive 102 is a stepper motor or a servo motor, wherein the drive control 104 sets the position of the Kelvin probe face 124. In this case, a shaft encoder is not necessarily required.

In one embodiment, the Kelvin probe head is replaceable with other heads having different materials.

Figure 6:
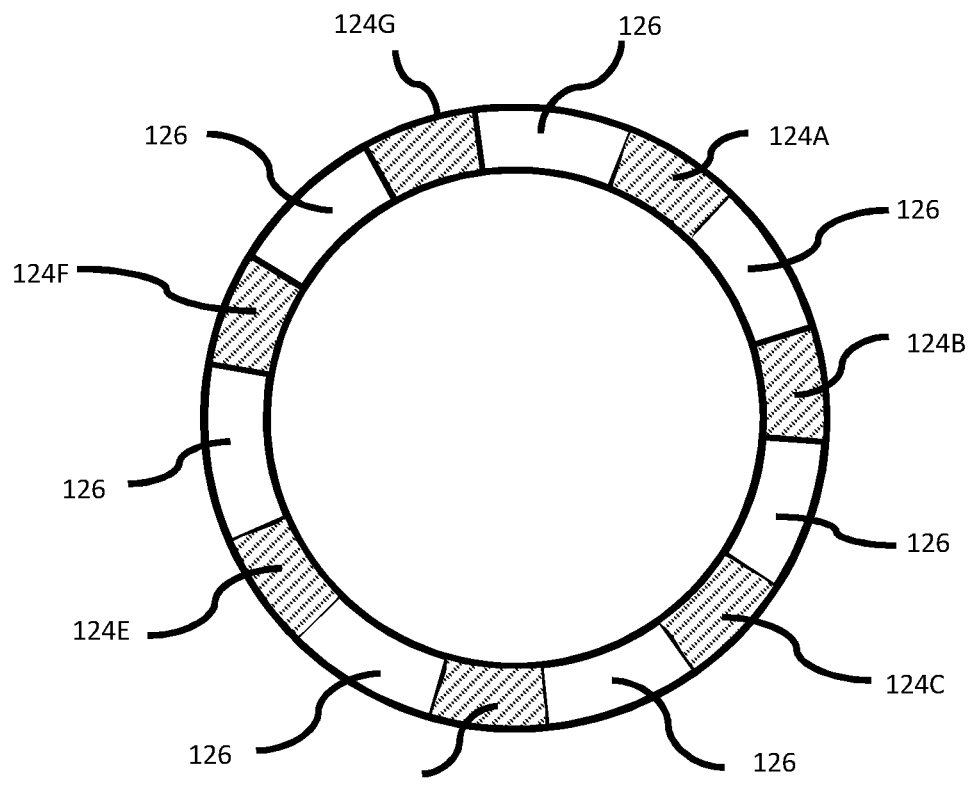
FIG. 6 shows an embodiment of the invention comprising a plurality of Kelvin probe faces of the same sizes.

FIG. 6 shows an embodiment where the Kelvin probe head is provided with a plurality of Kelvin probe faces 124. These can be positioned at different angular positions along the surface of the Kelvin probe head and separated by isolator 126. These probe faces can be sampled in turn, or be connected to one of a plurality of slip rings or rotating electrical connectors for connection to the electronics unit.

The Kelvin probe faces can be of the same material or of different materials. A face can be made of a single material, an alloy of materials, by facets of different materials, or be of different materials stacked in layers. For instance, an outer wear-resistant layer can be advantageous, especially in harsh environments. Also, the various Kelvin probe faces on the Kelvin probe head can be different from the neighboring Kelvin probe faces. This means one Kelvin probe head can be provided with a plurality of Kelvin probe faces adapted to detect specific sample materials, especially useful in exploratory cases where the nature of the sample under test is not fully known.

In yet another embodiment, the Kelvin probe faces can also be distributed across the width of the Kelvin probe head, the width of the Kelvin probe head being in a direction substantially parallel to the rotational axis. The technical effect of this is to measure the sample for testing at different positions which in turn can provide faster measurement across a wider area, even without having to move the probe.

Figure 7:
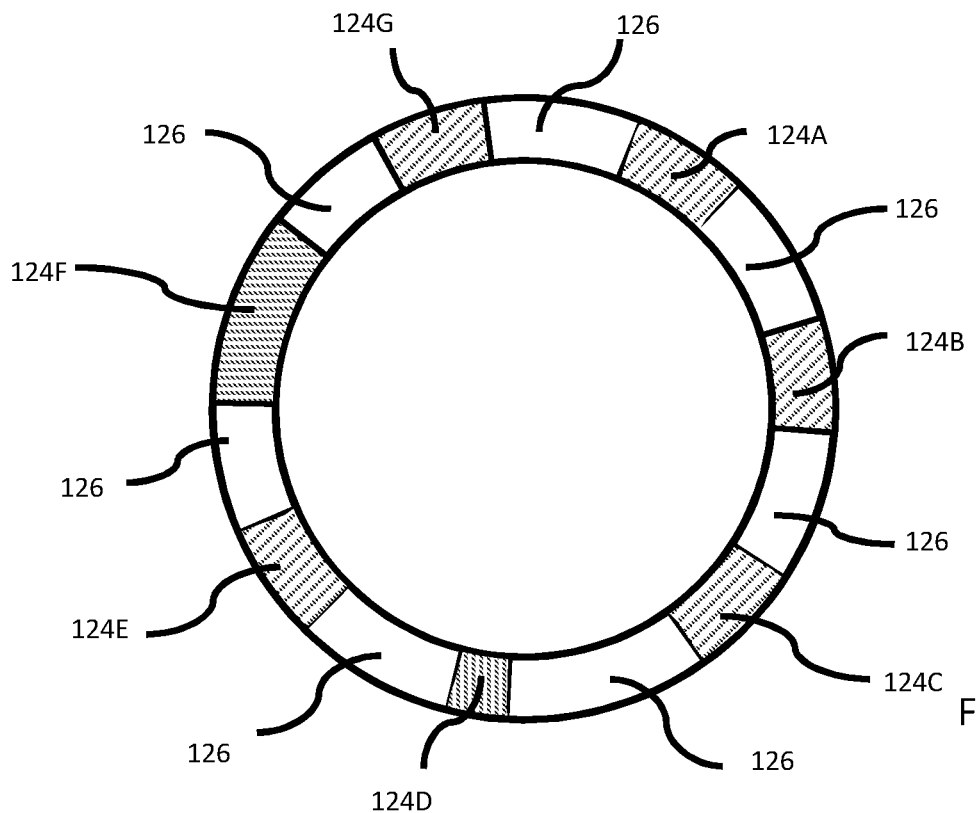
FIG. 7 shows an embodiment of the invention comprising a plurality of Kelvin probe faces of different sizes.

FIG. 7 shows a further embodiment where the Kelvin probe faces 124A-124G are of different sizes, for instance, by having a different angular extent and/or extent along the angular axis. This can provide flexibility with respect to sensitivity, where large area Kelvin probe faces provide great sensitivity while Kelvin probe faces with a small area will provide high resolution in positioning.

Obviously, the above variations can be combined, such as using a plurality of Kelvin probe faces that are distributed at different angular positions and also across the width of the Kelvin probe head. The Kelvin probe faces can be made of one material or a plurality of materials, and be field replaceable to adapt and optimize to findings in the exploratory phase.

Figure 8:
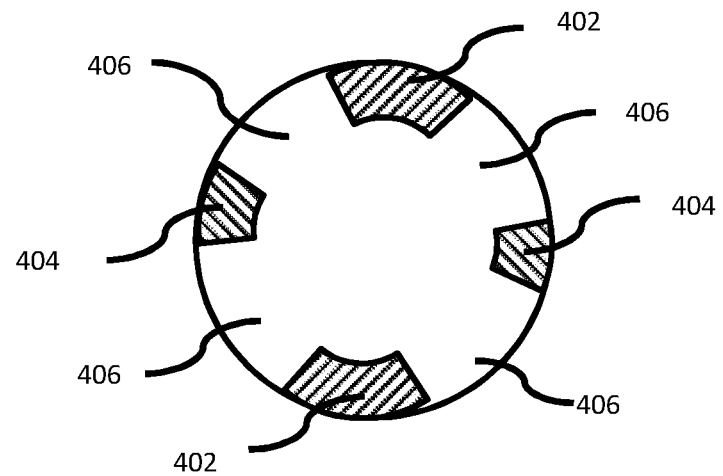
FIG. 8 shows an embodiment of the invention comprising four Kelvin probe faces of two sizes.

FIG. 8 shows an exemplary embodiment of the invention comprising four Kelvin probe faces of two sizes. A first pair of Kelvin probe faces 402 located diametrically opposite to each other have a longer angular extent than a second pair of Kelvin probe faces 404 located diametrically opposite each other and interleaved with the first pair. Each Kelvin probe face is separated from the adjacent Kelvin probe faces with an insulator 406.

Figure 9:
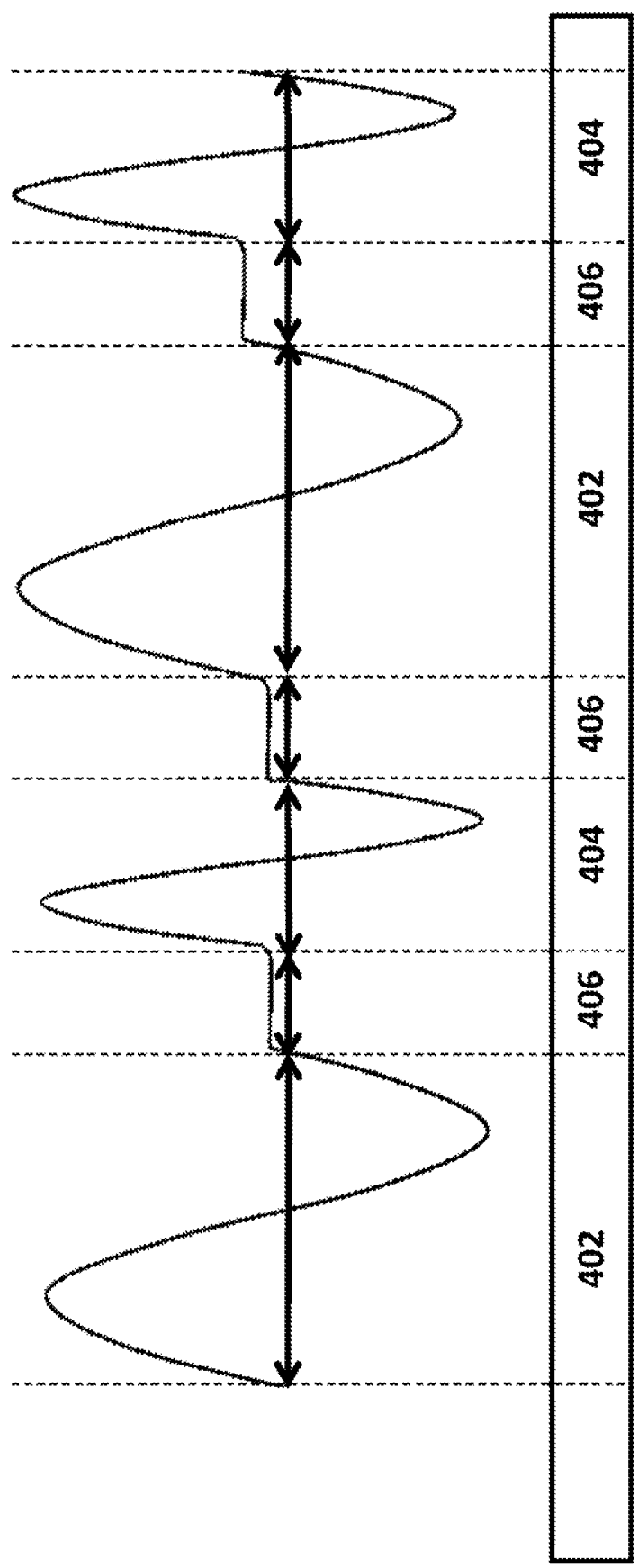
FIG. 9 shows a readout using a configuration as shown in FIG. 8.

FIG. 9 shows a readout using a configuration as shown in FIG. 8, wherein the vertical axis represents a signal strength and the horizontal axis represents time, and also is labelled indicating which Kelvin probe face is measuring the sample under test. As is clearly shown, the larger, first pair of Kelvin probe faces 402 provides a broader signal than the smaller, second pair of Kelvin probe faces 404, while the insulating areas 406 result in negligible readings.

While the strongest signals will be achieved by performing the measurement when the Kelvin probe face is closest to the sample to be measured, it should be noted that the rotational motion of the Kelvin probe head means that there is a range of angular positions of the Kelvin probe head where the Kelvin probe face is sufficiently close to the sample to be measured to return usable readings. These measurements will be located spatially before and after the point of closest position. This means that a spatially-extended reading can be provided.

Similarly, the above calibration processes can also be performed at a range of angular positions of the Kelvin probe head where the Kelvin probe face is sufficiently close to the calibration sample to return usable readings.

This extent of measurements will be substantially perpendicular to the width of the Kelvin probe head being in a direction substantially parallel to the rotational axis, and thus also, to Kelvin probe faces distributed across the width of the Kelvin probe head.

This can be used to create 2D mapping of a sample at a rate higher than measuring a single point at every rotation. This in turn can be used to determine a gradient of change, and a portable Kelvin probe system can be provided with indicators to show the direction of the center of a corroded area. Such an indicator can be 4 arrows indicating if the Kelvin probe system should be moved forward or backwards with respect to the rotation of the Kelvin probe head, or sideways along the axis of rotation. This will allow an operator to quickly locate corrosion. Alternatively, the system can be used to control a traverse mechanism to move the Kelvin probe system across a sample to be tested having an extended area.

When detecting several different materials, it can be advantageous to calibrate the system with several calibration samples that each represent what one expects to find. Thus, the calibration can be improved using calibration samples each located at different angular positions.

In one embodiment, it is desired to measure a sample, such as a metal, that has been exposed to hydrogen, and also measure similar material not exposed to hydrogen. The calibration method then comprises the steps calibration performed on a first calibration sample made of a material corresponding to a sample to be measured having not been exposed to hydrogen, and calibration performed on a second calibration sample made of a material corresponding to a sample to be measured that has been exposed to hydrogen.

In one embodiment, the metal is steel. In a preferred embodiment, the method further comprises depositing a layer of Pd on the metal prior to measurement.

The shaft 106 provides mechanical contact between the drive 102 and the Kelvin probe head 120. In an alternative embodiment, the drive is directly connected to the Kelvin probe head without the use of a shaft.

For specialised use, the slip ring 108 can be replaced by different forms for pick-ups, such as a wire spool that is coiled and un-coiled. In some cases, there is a limit to the number of revolutions that can be made before having to reverse the process. Also, a mercury drop can be used for providing electrical contact, or capacitive couplings can be used.

The invention according to the application finds use in material analysis, particularly measurements of corrosion and/or hydrogen permeation through metallic materials, and can be used in most situations where traditional Kelvin probe systems have been employed.

The invention claimed is:

1. A Kelvin probe system for analyzing a sample for testing, the Kelvin probe system comprising:
   a drive controlled and powered by a drive control/power for rotating a Kelvin probe head around a rotational axis,
   the Kelvin probe head connected to the drive, comprising at least one Kelvin probe, having at one end a Kelvin probe face,
   wherein the Kelvin probe face is provided on a side face of the Kelvin probe head with respect to the rotational axis, such that the surface of the sample for testing, which surface faces the Kelvin probe face, is substantially parallel with the rotational axis.

2. The Kelvin probe system according to claim 1, wherein the Kelvin probe head comprises a plurality of Kelvin probe faces.

3. The Kelvin probe system according to claim 2, wherein the plurality of Kelvin probe faces are made of more than one material.

4. The Kelvin probe system according to claim 3, wherein at least one Kelvin probe face is made of more than one material.

5. The Kelvin probe system according to claim 3, wherein more than one of the Kelvin probe faces are of made of different material.

6. The Kelvin probe system according to claim 2, wherein more than one of the Kelvin probe faces are of different sizes.

7. The Kelvin probe system according to claim 2, wherein the plurality of Kelvin probe faces are distributed at different angular positions along the surface of the Kelvin probe head.

8. The Kelvin probe system according to claim 2, wherein the plurality of Kelvin probe faces are distributed at different positions along the width of the Kelvin probe head.

9. The Kelvin probe system according to claim 2, wherein at least one Kelvin probe face is detachable.

10. A calibration system for a Kelvin probe system according to claim 1, wherein the Kelvin probe system further comprises:
    at least one calibration sample located away from a sample to be measured, wherein the at least one calibration sample operates as a built-in reference surface for the calibration of the rotating Kelvin Probe.

11. The calibration system for a Kelvin probe system according to claim 10, comprising a plurality of calibration samples, wherein the calibration samples are made of different materials.

12. The Kelvin probe system according to claim 1,
    wherein the at least one Kelvin probe face comprises a plurality of Kelvin probe faces distributed at different angular positions along the surface of the Kelvin probe head,
    wherein at least one of the plurality of Kelvin probe faces is provided on a side face of the Kelvin probe head with respect to the rotational axis, and
    wherein at least one of the plurality of Kelvin probe faces is detachable.

13. The Kelvin probe system according to claim 12, wherein at least one of the plurality of Kelvin probe faces is made of more than one material.

14. A method for measuring the presence of hydrogen using a Kelvin probe system according to claim 1, wherein the Kelvin probe system measures at least one from the group of surface charges and interface dielectric constants, at a metallic interface in a sample to be measured.

15. The method according to claim 14, wherein the Kelvin probe system further comprises a calibration system for the Kelvin probe system including a calibration sample located away from a sample to be measured, wherein the calibration sample operates as a built-in reference surface for the calibration of the rotating Kelvin Probe, wherein:
   calibration is performed on a first calibration sample made of a material corresponding to a sample to be measured having not been exposed to hydrogen, and
   calibration is performed on a second calibration sample made of a material corresponding to a sample to be measured that has been exposed to hydrogen.

16. The method according to claim 14, wherein the method further comprises depositing a layer of palladium over the sample to be measured prior to operating the Kelvin probe system.

17. A calibration system for a Kelvin probe system for analyzing a sample for testing, the Kelvin probe system comprising:
   a drive controlled and powered by a drive control/power for rotating an object around a rotational axis,
   a Kelvin probe head connected to the drive, comprising a Kelvin probe, having at one end a Kelvin probe face,
   wherein the Kelvin probe face is provided on a side face of the Kelvin probe head with respect to the rotational axis, and
   a calibration sample located away from a sample to be measured, wherein the calibration sample operates as a built-in reference surface for the calibration of the rotating Kelvin Probe.

18. A method for measuring the presence of hydrogen using a Kelvin probe system, the Kelvin probe system including:
   a drive controlled and powered by a drive control/power for rotating a Kelvin probe head around a rotational axis,
   connecting the Kelvin probe head to the drive, the Kelvin probe head comprising a Kelvin probe, having at one end a Kelvin probe face,
      wherein the Kelvin probe face is provided on a side face of the Kelvin probe head with respect to the rotational axis,
      wherein the method comprises having the Kelvin probe system measure at least one from the group of surface charges and interface dielectric constants, at a metallic interface in a sample to be measured; and
      wherein a surface of the sample to be measured faces the Kelvin probe face and is substantially parallel with the rotational axis.

19. The method according to claim 18, wherein the Kelvin probe system further comprises a calibration system for the Kelvin probe system including a calibration sample located remotely relative from a sample to be measured, wherein the calibration sample operates as a built-in reference surface for the calibration of the rotating Kelvin Probe, wherein
   calibration is performed on a first calibration sample made of a material corresponding to a sample to be measured having not been exposed to hydrogen, and
   calibration is performed on a second calibration sample made of a material corresponding to a sample to be measured that has been exposed to hydrogen.

20. The method according to claim 19, wherein the method further comprises depositing a layer of palladium over the sample to be measured prior to operating the Kelvin probe system.

* * * * *